United States Patent [19]

Cantor et al.

[11] Patent Number: 5,424,588
[45] Date of Patent: Jun. 13, 1995

[54] SELF-CONTAINED, PORTABLE COMPACT LOAD BANK AND TESTING METHOD; COMPACT LOAD BANK WITH IMPROVED POWER HANDLING CAPABILITY

[76] Inventors: Thomas L. Cantor, 1532 Spackman La., Exton, Pa. 19341; William P. Cantor, 5 Still Pond Dr., New Freedom, Pa. 17349; John A. Cantor, 356 Devon Dr., Exton, Pa. 19341

[21] Appl. No.: 287,700

[22] Filed: Aug. 9, 1994

Related U.S. Application Data

[63] Continuation of Ser. No. 864,784, Apr. 7, 1992, abandoned.

[51] Int. Cl.⁶ .................................................. G01N 27/42
[52] U.S. Cl. .................................................. 307/154
[58] Field of Search ........................... 338/50, 281–282, 338/296, 297, 48, 286; 307/154; 324/424; 320/5, 19, 13, 39, 45

[56] References Cited

U.S. PATENT DOCUMENTS

| | | | |
|---|---|---|---|
| 2,690,544 | 9/1954 | Haubursin | 339/152 |
| 2,829,336 | 4/1958 | Heyer | 324/29.5 |
| 3,500,167 | 3/1970 | Applegate et al. | 320/14 |
| 3,586,962 | 6/1971 | Rebstock | 324/29.5 |
| 3,593,099 | 7/1971 | Scholl | 320/13 |
| 3,599,094 | 8/1971 | Pring | 324/29.5 |
| 3,720,869 | 3/1973 | Rowlette | 324/29.5 |
| 3,808,522 | 4/1974 | Sharaf | 324/29.5 |
| 3,832,629 | 8/1974 | Cernek, Jr. | 324/29.5 |
| 3,848,181 | 11/1974 | Hebert, Jr. et al. | 324/29.5 |
| 3,873,911 | 3/1975 | Champlin | 324/29.5 |
| 3,876,931 | 4/1975 | Godshalk | 324/29.5 |
| 3,886,447 | 5/1975 | Tanaka | 324/60 |
| 3,895,284 | 7/1975 | Schweizer et al. | 320/48 |
| 3,899,732 | 8/1975 | Staby | 324/29.5 |
| 3,906,329 | 9/1975 | Bader | 320/44 |
| 3,969,667 | 7/1976 | McWilliams | 324/29.5 |
| 3,971,980 | 7/1976 | Jungfer et al. | 324/29.5 |
| 3,984,762 | 10/1976 | Dowgiallo, Jr. | 324/29.5 |
| 4,028,616 | 6/1977 | Stevens | 324/29.5 |
| 4,044,300 | 8/1977 | Dupuis et al. | 324/29.5 |
| 4,052,717 | 10/1977 | Arnold et al. | 340/249 |
| 4,053,824 | 10/1977 | Dupuis et al. | 324/29.5 |
| 4,134,060 | 1/1979 | Feldman | 324/29.5 |
| 4,140,958 | 2/1979 | Groeschel | 320/14 |
| 4,163,146 | 7/1979 | Meywald | 219/542 |
| 4,278,877 | 7/1981 | Werych | 219/544 |
| 4,307,345 | 12/1981 | Schoen | 324/424 |
| 4,333,149 | 6/1982 | Taylor et al. | 364/481 |
| 4,352,067 | 9/1982 | Ottone | 324/434 |
| 4,449,579 | 5/1984 | Miyazaki et al. | 165/104.33 |
| 4,774,631 | 9/1988 | Okuyama et al. | 361/384 |
| 4,839,597 | 6/1989 | Rowland | 324/433 |
| 4,888,716 | 12/1989 | Ueno | 364/550 |
| 4,906,055 | 3/1990 | Horiuchi | 307/354 |

*Primary Examiner*—Steven L. Stephan
*Assistant Examiner*—Aditya Krishnan
*Attorney, Agent, or Firm*—James H. Dautremont

[57] ABSTRACT

A portable, self-contained and compact load bank of wire wound resistors utilizes wire wound resistors which are air cooled by a fan mounted in a venturi wherein the load resistors may dissipate power at up to six times their power rating. Current flow through the resistors is controlled by a transistor bank and portions of the resistors may be shorted out through taps connected to SCR's, with both the SCR's and the transistors being controlled by a microprocessor. The load bank is fully automatic, and because of highly effective air cooling, minimization of air flow resistance and use of edge wound resistors, the load bank is highly portable due both to its compact size enabling travel through normal passageways and its reduced weight. Both the microcontroller circuitry and the resistive load dissipation circuitry are contained within the same unit and are electrically isolated from each other by optical isolators. The load bank may be utilized for the testing of batteries, DC power supplies or any other DC source.

14 Claims, 11 Drawing Sheets

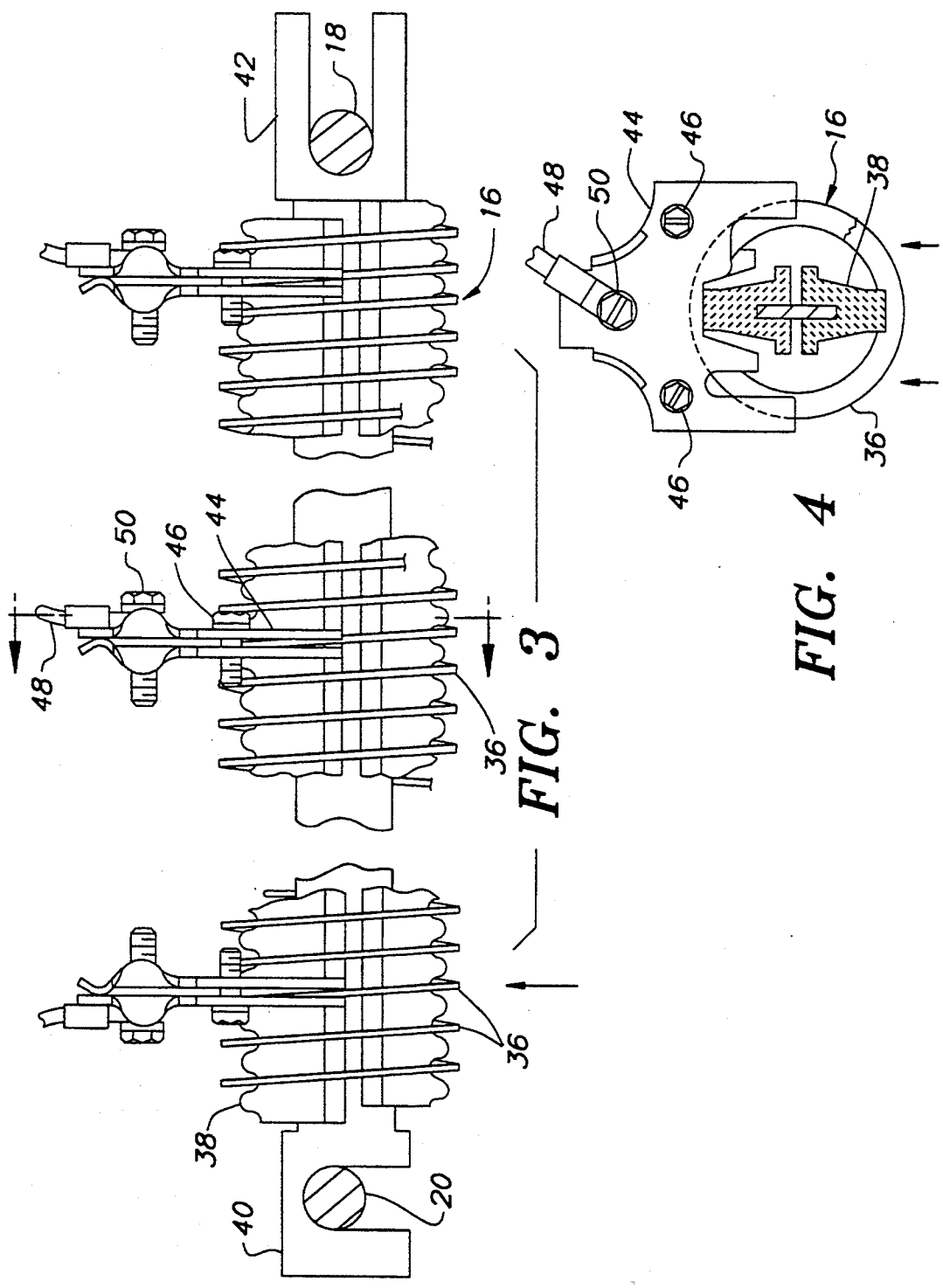

SELF-CONTAINED, PORTABLE COMPACT LOAD BANK AND TESTING METHOD; COMPACT LOAD BANK WITH IMPROVED POWER HANDLING CAPABILITY

This is a continuation of application Ser. No. 0/864,784, filed on Apr. 7, 1992, now abandoned.

BACKGROUND OF THE INVENTION

The present invention relates to an improved microprocessor controlled load bank. More particularly, the present invention relates to a load bank which is self-contained, compact and portable.

There has been a great need for a self-contained, compact and portable load bank for the testing of batteries and/or DC power supplies, and particularly DC power supplies utilized to recharge the batteries. Many systems today, and particularly large telephone systems utilize large batteries for emergency power in the case of a power failure. It is essential that the batteries be tested so that they can supply the necessary DC power during an emergency power outage, and particularly during an emergency power outage of extended duration. Without proper testing, and maintenance as a result of that testing, telephone companies and others that rely upon such emergency backup battery power have no way of knowing whether or not the batteries will function properly when an emergency occurs. Only by proper testing under controlled loads, with controlled current drain for a predetermined period, can the battery and each of its cells be effectively tested. It is only with such testing that any defective or unacceptably weak cells in the battery can be replaced or repaired, or other necessary repairs performed such as the correction of bad connections.

Battery analyzers utilizing load bank resistors controlled by a microprocessor are known, for example see U.S. Pat. No. 4,352,067-Ottone. However, self-contained, compact and portable load banks for such testing have not been available. Furthermore, fine control of load bank resistance that can maintain constant current has not been available.

SUMMARY OF THE INVENTION

Briefly and basically, the present invention is directed to a load bank for controlled loading of a DC source of any type, but the DC source is usually a battery or a DC power supply which is being tested and/or analyzed. The load bank includes a plurality of wire wound resistors adapted to be selectively connected to the DC source. The load bank is able to be made compact and portable by use of a fan for moving air across the wire wound resistors for cooling them.

By cooling the wire wound resistors, it is possible to have the wire wound resistors dissipate power at a rate greater than their power rating. This enables the use of reduced size wire wound resistors.

In a preferred embodiment of the invention, the fan is provided with a venturi which provides an enhanced cooling effect. In a preferred embodiment, the wire wound resistors are edge wound resistors which are spaced, rectangular, flattened or platelike wire in cross-section helically wound on a ceramic core which presents a fin-like cooling effect. The method of mounting the wire wound resistors enables them to be readily replaced or adjusted.

In a preferred embodiment, the wire wound resistors are provided with one or more taps. Current flow through the wire wound resistors is controlled by a bank of transistors and a bank of SCR's. The SCR's are connected to the taps on the wire wound resistors and enable the shorting out of portions of the wire wound resistors for more selective control of the resistive load connected across the DC source.

Just as importantly as the testing of the batteries, is the testing of the power supplies that are necessary to recharge the batteries. In fact, the testing of the batteries results in a substantial draining of the charge on the batteries, and the method developed by the inventors herein is to test the DC power supply utilized to recharge the batteries before draining of the batteries during the testing process. In this manner, a weak or defective rectifier or other problem in the DC power supply may be detected and remedied before an emergency power outage occurs. Only when the testing method includes the step of testing the DC power supply and its rectifiers under significant load can there be a significant level of confidence with respect to the power system both during an emergency and in the period following an emergency. It has been recognized by the inventors herein that the DC power supply and its rectifiers are put under the most severe load immediately after a substantial period of reliance on the batteries, as at that time the DC power supply and its rectifiers are providing both DC operating power for the system and the current necessary to recharge the batteries.

BRIEF DESCRIPTION OF THE DRAWINGS

For the purpose of illustrating the invention, there are shown in the drawings forms which are presently preferred; it being understood, however, that this invention is not limited to the precise arrangements and instrumentalities shown.

FIG. 3 is a side elevation view of an edge wound wire resistor utilized in accordance with the present invention.

FIG. 4 is an end view of the edge wound wire resistor of FIG. 3.

DETAILED DESCRIPTION OF THE PREFERRED EMBODIMENTS

Figure 1:
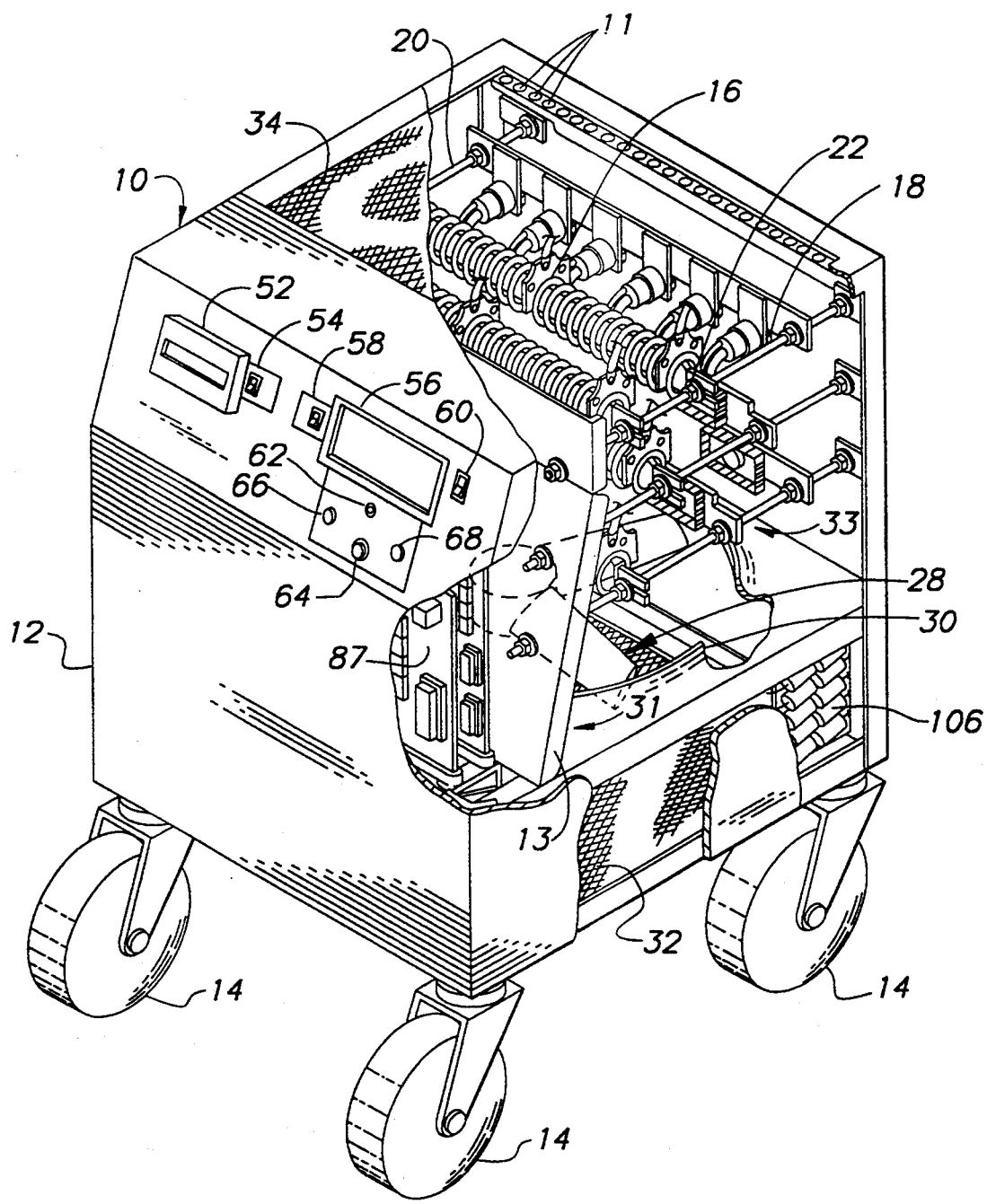
FIG. 1 is a view in perspective, partially broken away, of a self-contained, compact and portable load bank in accordance with the present invention.

Referring now to the drawings wherein like numerals indicate like elements, there is shown in FIG. 1 an automatically controlled, self-contained, portable compact load bank 10 in accordance with the present invention. The load bank 10 is provided with a cabinet or housing 12 mounted on wheels or casters 14. Mounted within the housing 12 are a plurality of wire wound resistors 16 for dissipating power during the test. In other words, during the test, it is desired to place a varying load on the batteries or DC power supply being tested such that a constant current drain is placed on the DC source for a predetermined period of time. Although other types of resistors may be utilized in practicing the invention, in a presently preferred embodiment, the wire wound resistors 16 are edge wound resistors having a structure as illustrated in FIGS. 3 and 4, to be described hereinafter in greater detail.

Figure 2:
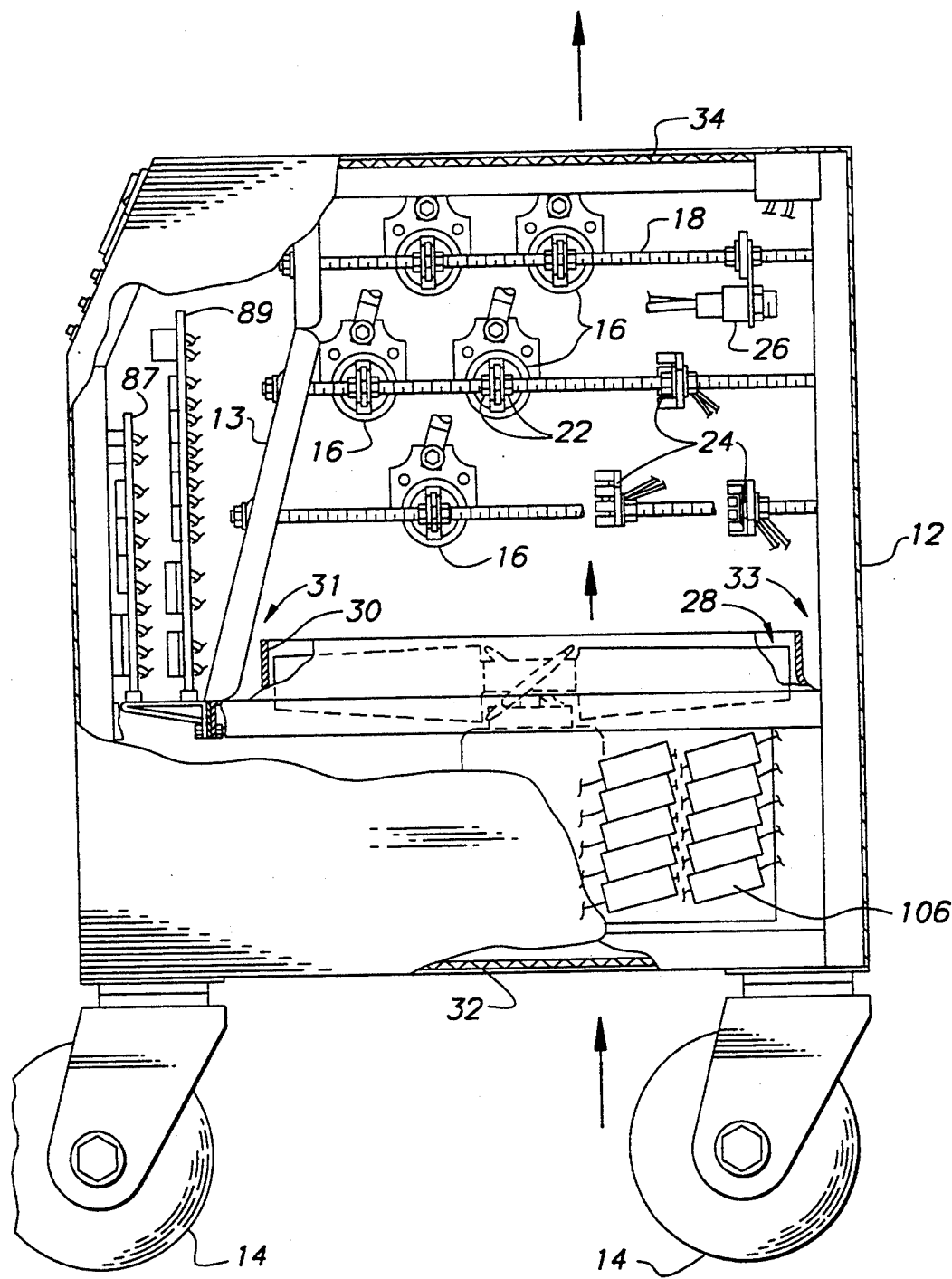
FIG. 2 is a side elevation view, partially broken away, of the load bank of FIG. 1.

The wire wound resistors are mounted on racks formed by threaded bars 18 and 20. The method of mounting the wire wound resistors on bars 18 and 20 is suggested by the structure of the resistors shown in FIG. 3, and they are secured by nuts 22 on each side. Referring to FIG. 2, solid state switching devices such as transistors 24 and (silicon controlled rectifiers) SCR's 26 are similarly mounted on the threaded bars 18 and 20.

The edge wound wire resistors 16 and the solid state switching devices 24 and 26 are mounted such that they are in the path of significant air flow generated by fan 28. Fan 28 is preferably a four blade, cast aluminum fan with a venturi 30. In a preferred embodiment, a Dayton cast aluminum blade venturi fan commercially available under stock number 7F450 from W. W. Granger Inc. of Norristown, Penn. may be utilized. The air flow is directed upward through an expanded metal screen 32 across the wire wound resistors 16 and the solid state switching devices 24 and 26 and out through an upper expanded metal screen 34.

In achieving the objects of the present invention of a self-contained, compact and portable automatically controlled load bank for testing DC sources, maximum air flow and cooling effect is important. Accordingly, screening with an absolute minimum of air flow resistance, which is achieved by means of expanded metal screening provides significant advantages. In other words, drilled hole screening with substantial blockage between holes would cut down significantly on air flow. The expanded metal screening is of the type commercially available wherein the sheet metal is cut and the metal is expanded turning the structure between the holes in a direction parallel to the air flow thereby providing an absolute minimum of air flow resistance, and while at the same time providing suitable protection to prevent persons' body parts or other items from entering the housing with the exposed electrical components.

The venturi 30 is preferably designed such that it is in close contact with the housing or cabinet metal 12. This provides a maximum area for the air flow path and also prevents eddy current formation above the venturi and between the outer edge of the venturi and the inner wall of the cabinet 12 and baffle 13. For example, see areas 31 and 33 illustrated in both FIGS. 1 and 2. Additionally as may be best seen from FIG. 2, the wire wound resistors 16 along with the banks of transistors 24 and SCR's 26 are arranged in such a staggered manner as to provide minimum obstruction to air flow and maximum air flow across each component. It is noted that one component, such as a resistor, does not block the air flow to another resistor, the transistors nor the SCR's.

Further, as may be seen from FIGS. 3 and 4, maximum cooling is provided to the edge wound wire resistors which are in the form of a helix 36 of a material rectangular in cross-section with the height of the rectangle being much greater than the width, in other words having a flattened configuration similar to plate material in cross-section. This rectangular wire is helically wound around a ceramic core 38. The resulting structure is similar to fins 36 mounted around a ceramic core 38. This provides maximum unobstructed air flow between the spaced windings 36 with a large surface area along the height of the material. The direction of air flow is shown by the arrows in FIGS. 2, 3 and 4.

The edge wound resistors 16 are provided with metal mounting brackets 40 and 42. In mounting the edge wound resistors 16 on the threaded bars 18 and 20, mounting bracket 42 is inserted onto threaded bar 18 and mounting bracket 40 is lowered onto bar 20. These are then securely fixed in place by means of nuts 22 tightened on both sides of mounting brackets 40 and 42. The mounting brackets 40 and 42 are insulated from the windings 36 by means of the ceramic insulator 38.

Connections are made to the windings 36 by means of terminal clamps 44. Terminal clamps 44 are provided with a pair of threaded fasteners 46 which securely clamp the terminal to winding 36. The wire 48 is connected by means of a terminal lug 50. Edge wound wire power resistors 16 of the preferred embodiment are commercially available from Ohmite Manufacturing Company, 3601 Howard Street, Skokie, Ill. 60076.

In a preferred embodiment, to reduce air flow resistance and back pressure, special wire is utilized which enables the use of small wire diameters for relatively large currents. For example, with the use of this wire, 30 amps of current may be carried on 18 gauge wire. Such wire is commercially available from F. L. Surprenant Wire and Cable Division of F. L. Industries, Inc. of Clinton, Mass. 01510 under their trademark EXANE. Use of such special cable reduces the cross-sectional area of the total cable utilized in the air flow path to make the connections to the wire resistors, transistors and SCR's, thereby reducing air flow resistance and enabling more effective cooling and heat dissipation.

In a preferred embodiment of the present invention, with the venturi air fan cooling, it has been possible to utilize wire wound resistors of 1/6 the power rating that would normally be required. In other words, with the effective air cooling achieved by the present invention, the edge wound wire resistors 16 may be operated at six times their rated power. This enables reduced weight, reduced size and the ability to produce a self-contained, compact, automatically controlled load bank for the testing of DC power supplies. This is important in that this test equipment needs to be taken into facilities to test DC power supplies and batteries wherein the access in many cases is normal passageways of 36 inches or less.

In accordance with the present invention, it has been possible to produce a compact, self-contained, automatic load bank having a capacity to continuously dissipate 45,900 watts (i.e. 850 amps at 54 volts) with dimensions of 22 inches wide, 26.5 inches deep and 34 inches high, including 6 inch wheels. This has been achieved in a portable unit on casters weighing approximately 200 pounds. The dimensions and specifications herein are not in any way deemed to limitations of the invention, and it is understood that various other dimensions may be utilized. These have been provided merely as an example of a presently preferred embodiment to illustrate an example of the dissipation capacity that may be achieved with minimal dimensions of the load bank.

Other advantages of the present invention include the fact that is self-contained and includes printing, display features and the ability to operate the unit with the use of only four buttons. The automatically controlled load bank of the present invention is totally self-contained and does not require separate electronics units connected to dissipating load banks and the like. As may be seen in FIGS. 1 and 2, the microcontroller and other electronics circuitry is contained on printed circuit boards 87 and 89 mounted within housing 12 in front of baffle 13. Also shown in FIG. 1 are printer 52 with printer off/on switch 54 and display 56 with switch 58 for selecting either main or cells display. Switch 60 is an off/on switch. Button 62 is a reset button. Button 64 is provided for entering data or pausing. The data is entered by a units button 66 and a tens button 68.

Figure 5:
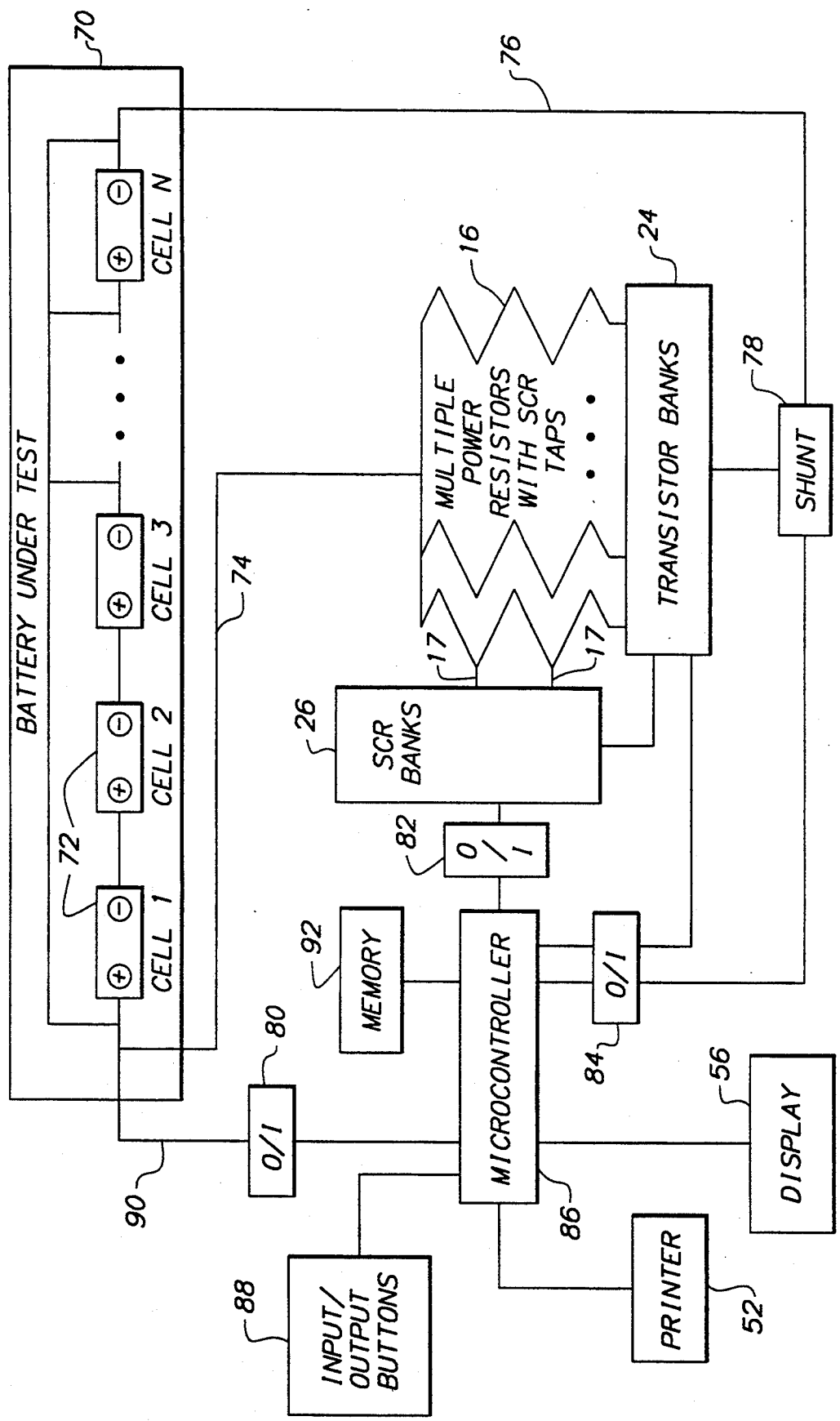
FIG. 5 is an overall block diagram of the electrical circuitry of the present invention.

Referring now to FIG. 5, there is shown an overall block diagram of the automatically controlled, self-contained, compact and portable load bank of the present invention. As illustrated in FIG. 5, the load bank 10 is illustrated as being connected to a battery under test 70 containing a plurality of cells 72. However, as explained above, it is understood that the present invention may be utilized to test any DC source and particularly DC sources utilizing rectifiers and the like. As illustrated in FIG. 5, the multiple power resistors 16 having taps 17 are connected across the battery or other DC source by leads 74 and 76. Current flow through the resistors is controlled by a bank of transistors 24. The current drawn by the batteries is measured by the voltage developed across a resistive shunt 78. Portions of resistors 16 may be shorted out by means of the bank of SCR's 26. All of the DC source voltages, current and noise are optically isolated from the control circuitry by means of optical isolators 80, 82 and 84. The transistor banks and SCR banks are controlled by the microcontroller or microprocessor 86. The microcontroller controls switching of the SCR banks and transistor banks in response to sensing the current flow from the battery via shunt 78 and in response to the values set via the input buttons 88. The input buttons 88 correspond to buttons 62, 64, 66 and 68 described with respect to FIG. 1. The test results can be printed on printer 52 and values and information in the set up and during the test can be displayed on display 56.

The purpose of the microcontrolled load bank is to provide a resistive load to batteries or to any DC power supply wherein the batteries may be discharged at a predetermined constant current rate while being monitored continuously.

Resistors 16 are switched into or out of the DC source (battery 70) discharge path by power transistors 24. Each resistor 16 has multiple taps connected to silicon controlled rectifiers (SCR's) 26. The microcontroller 86 fires the SCR to short out parts of resistors 16 thereby selectively lowering the resistance to increase the current drain on the battery under test. The microcontroller or microprocessor 86 controls the SCR's and the transistors to provide a discharge rate that is equal to the rate set by the operator via input buttons 88. Shunt 78 generates a voltage proportional to the discharge current which is supplied via optical isolator 84 to the microcontroller. The optical isolators will be described hereinafter. The automatic load bank monitors the battery total voltage and each cell voltage via monitor lines 90. Monitor lines 90, as well as others shown in FIG. 5, represent multiple lines. Monitor lines 90 in the case of a 24 cell battery would represent 26 lines, one for each cell plus one line connected to the positive and the other to the negative terminal of the battery. In the case of testing a D.C. power supply, only 2 lines would be used. These lines are connected to jacks 11 shown in FIG. 1.

The test operator inputs the desired rate in amperes, the time of the test in minutes, the number of battery cells, the time between each cell/battery voltage reading that is stored in memory in minutes, the time between each cell/battery voltage reading that is printed in minutes, the minimum battery voltage, and the minimum cell voltage. This data is displayed on display 56 and printed on printer 52. The test will stop when the minimum battery voltage is reached, the total test time set by the operator has elapsed, or the desired rate cannot be attained. The load bank will set an alarm each time a cell falls below the operator set cell voltage. If any cell voltage drops below 0.5 volts, the load bank will pause the test until that cell is jumped out of the battery under test. The load bank displays the actual cell voltages, battery voltage, discharge rate, elapsed time of test and ampere hours. Upon completion of the test, the test operator can review all the cell and battery voltages that have been stored in the memory 92.

Figure 6:
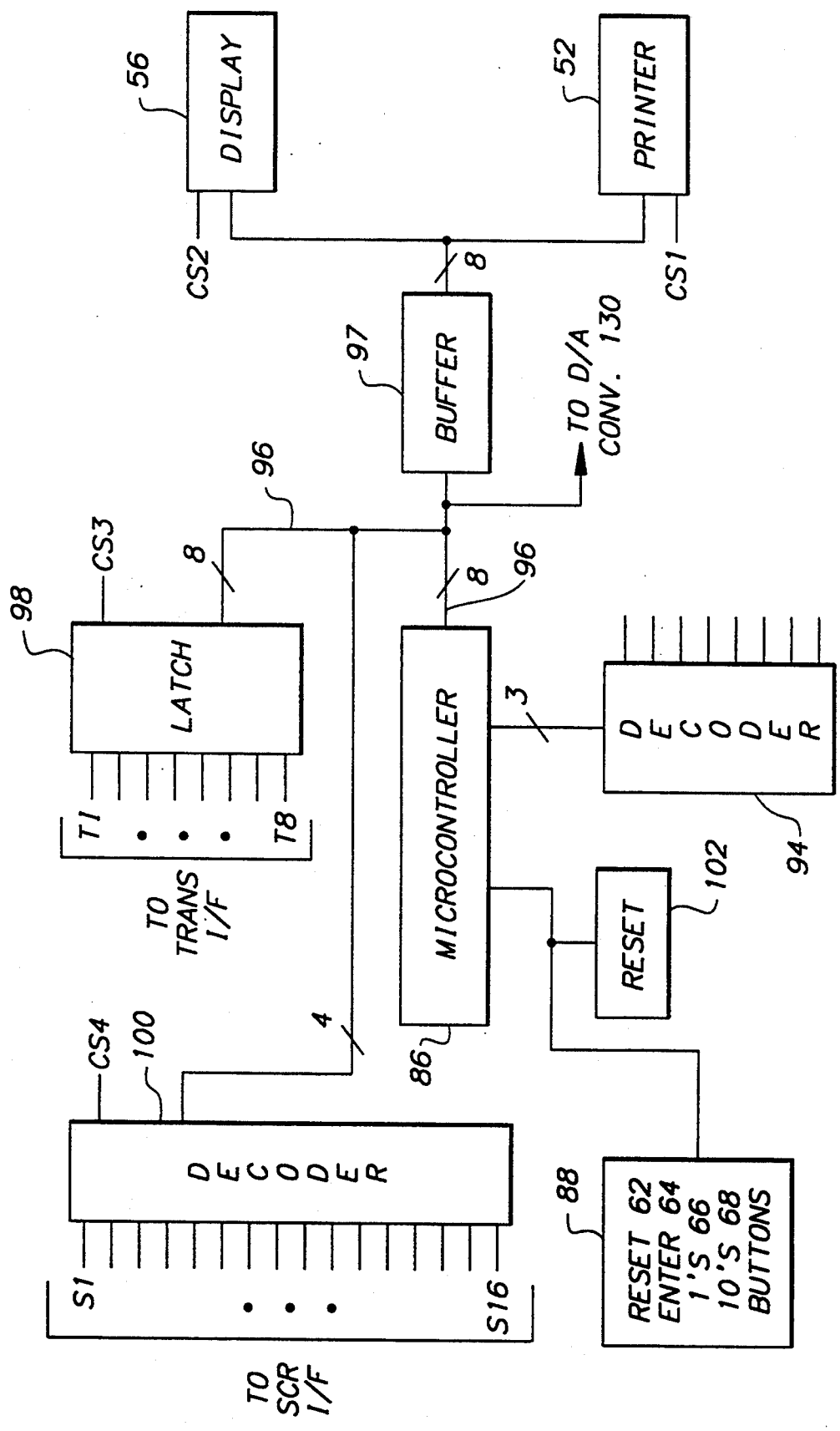
FIG. 6 is a block diagram of the microprocessor or microcontroller and peripheral circuitry in accordance with the present invention.

Referring now to FIG. 6, there is shown a microprocessor or microcontroller 86 which controls and monitors all of the functions of the load bank. An example of a presently preferred microcontroller is a Motorola MC68HC705C8 available from Motorola, Inc., 2200 W. Broadway, Mesa, Ariz. 85202. Other micro-controllers may be utilized add the present invention is not limited to this example of a presently preferred microprocessor. Microprocessor 86 contains its own EPROM (erasable programmable read only memory) and RAM (random access memory), and accordingly no external interfaced memory is required. The interfaces to the printer and display may be eight bit parallel interfaces, indicated by the cross line and "8" representing 8 lines. All timing and peripheral selection is controlled by microcontroller 86 utilizing the three bit decoder 94 which generates control signals CS1 through CS8.

The eight bit output bus 96 controls the transistors 24 through latch 98 upon receipt of a control signal CS3. The same bus 96 controls the SCR's via decoder 100 upon receipt of control signal CS4 from decoder 94. When a transistor 24 is to be activated, the command is latched by latch 98 to provide continuous driving current to the transistor. SCR's 26 need only a momentary pulse for activation, and accordingly a latching circuit is not required. SCR's are only reset when the associated transistor 24 is turned off causing a cessation of current through the associated resistor 16, tap 17 and the associated SCR. It is understood that although FIG. 6 only illustrates 8 transistor and 16 SCR outputs, more may easily be accommodated.

The microcontroller 86 interfaces with all of the analog to digital circuitry. The eight bit microcontroller output bus 96 also interfaces with the digital to analog converter shown 130 in FIG. 9 which is used to provide fine adjustment of the current flow through the load bank.

A power up reset circuit 102 is provided to insure that the unit is turned on in an orderly fashion during power up and during conditions of low supply voltages, The operator interface is primarily a set of four buttons on the front panel. The minimal number of buttons are provided to make the load bank user friendly. Menus are displayed by the microcontroller via the display 56 to provide clear, concise instructions for the operator. The reset button 62 is provided to allow the operator to restart the system without removing the power to the unit.

Figure 7A:
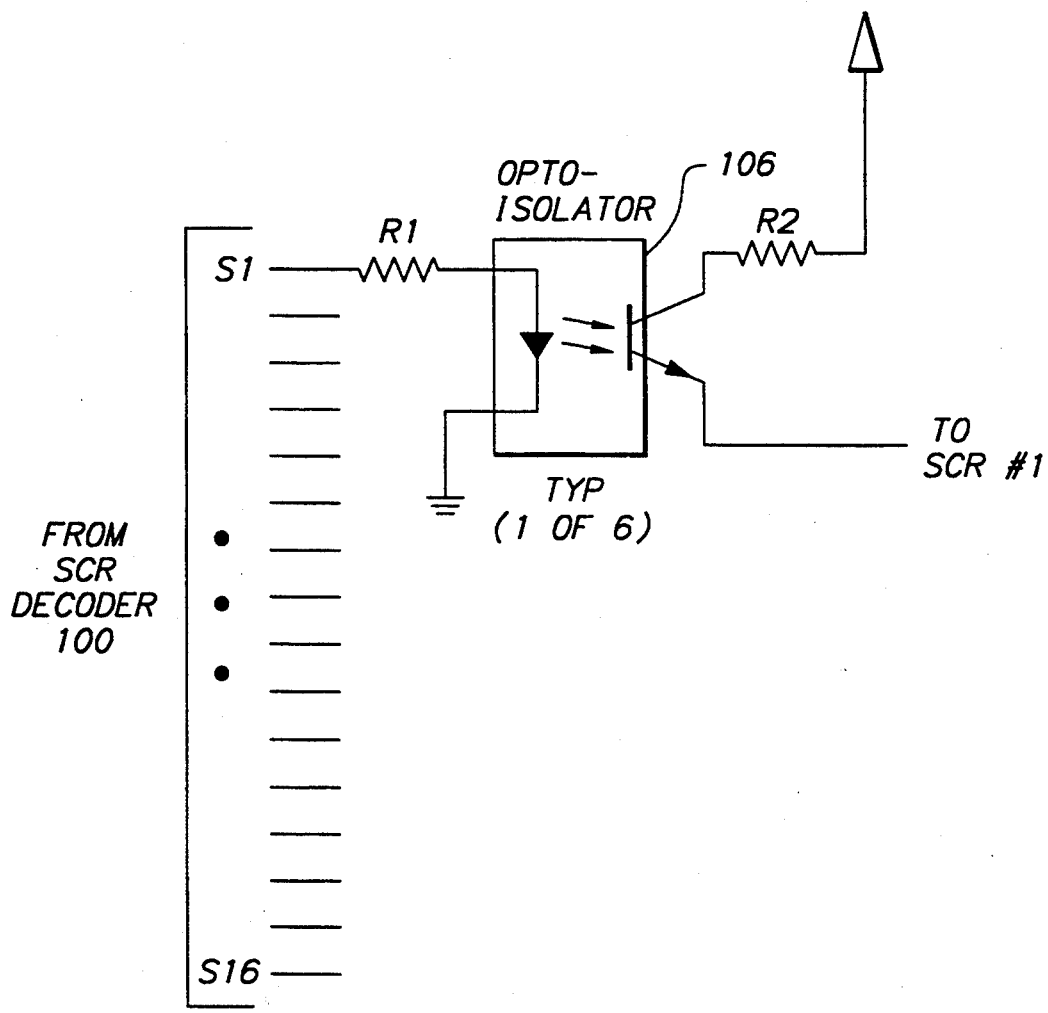
FIGS. 7A and 7B are block diagrams of the SCR and transistor interface circuitry of the present invention, respectively.
Figure 7B:
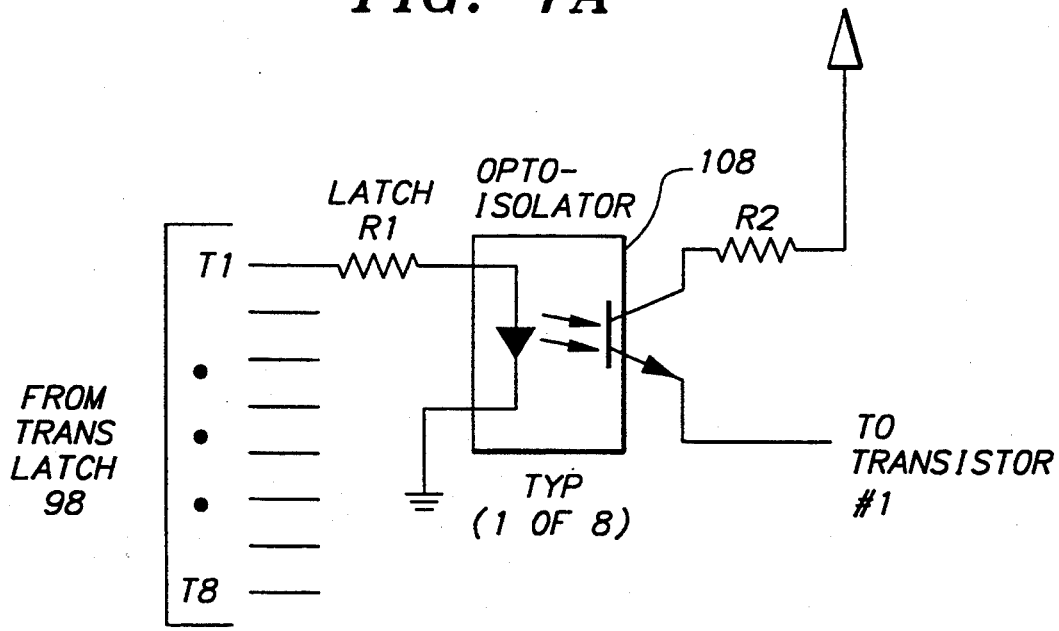

The output on bus 96 is provided to display 56 and to printer 52 via buffer 97. Referring now to FIGS. 7A and 7B, the SCR's and transistors located in the load bank section are electrically isolated from the microcontroller circuitry via optical isolators. This prevents any unwanted ground loops and separates the high current/voltage circuitry from the low voltage/low current circuitry associated with the microcontroller. Additionally, noise cannot flow from the microcontroller electronics to the battery and vice versa. SCR and power transistors are also separated since the grounds for these two systems are not at the same location. The optical isolators provide reliable electrical isolation. When a signal is applied to optical isolators 106 and 108, as well as the other optical isolators utilized herein, light is produced which in turn activates a corresponding transistor which allows current to flow to the associated SCR or transistor. Resistors R1 and R2 are provided to limit the current on both sides of the interface which prevents damage to the device while providing enough current to allow the equipment to operate. One optical isolator is provided for each SCR and transistor required by the load bank. Presently preferred optical isolators are commercially available and are referred to as optoisolators. As presently preferred, in the transistor and SCR interfaces of FIGS. 7A and 7B, optical isolators are available from Motorola Inc. under the designation of TIL113. Additionally, in the digital to analog interface of FIG. 9, optical isolators are available under part number 4N28 from Motorola Inc. The presently preferred optical isolator used in the analog to digital interface of FIG. 10 is available as part number HCPL-2200 from Hewlett Packard Corporation. Signals shown in the drawings with an asterisk indicates that those signals are processed through an optical isolator to provide electrical isolation as described.

Figure 8:
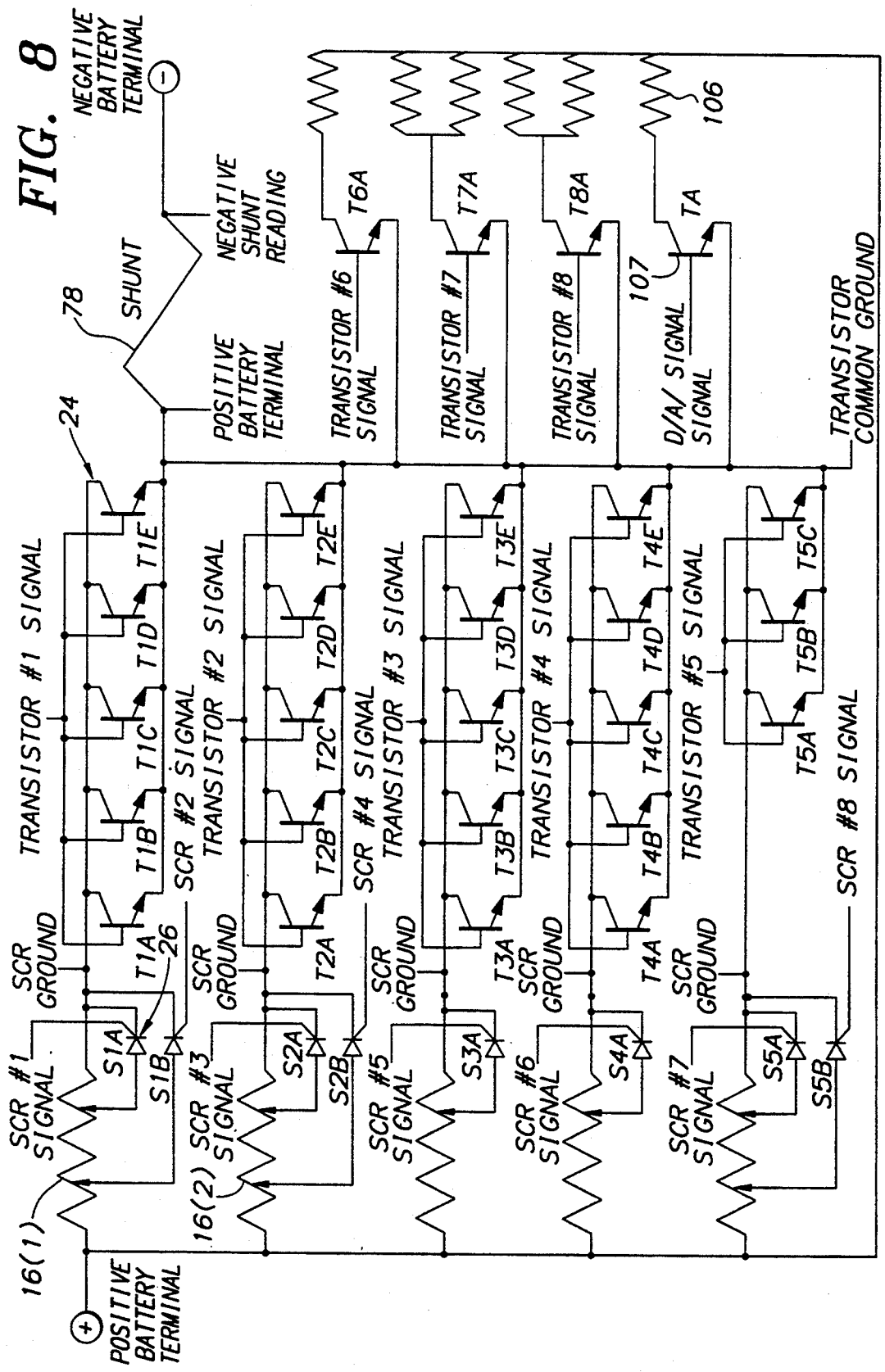
FIG. 8 is a schematic diagram of the power dissipation circuitry of the load bank including the edge wound wire resistors, other resistors, and the transistor and SCR banks.

Referring now to FIG. 8, there is shown the edge wound wire resistors 16 with taps 17. The edge wound resistors 16 are connected in series across the battery terminals, and in parallel with each other, by means of transistors collectively referred to as 24. As may be seen, in a preferred embodiment, each wire wound resistor may be connected by a plurality of transistors in parallel, for example T1A-T1E. In a similar manner, other wire wound resistors 16 may be connected in series with the battery terminals, and in parallel with the other wire wound resistors, by parallel connected transistors T2A through T2E. Further, portions of resistors 16 may be shorted out of the circuit by means of SCR's collectively referred to as 26, and as shown with respect to resistor 16(1) to be comprised of SCR's S1A and S1B. Similarly, portions of edge wound wire resistors 16(2) may be shorted out by silicon controlled rectifiers S2A and/or S2B. As is well known in the art, the more resistors that are connected in parallel, the lower the resistance.

Additionally, resistor 106 may be selectively connected in parallel with resistors 16 via transistor 107 (TA) with the current through resistor 106 being precisely varied by transistor 107 in response to a signal supplied by digital to analog converter 130 (FIG. 9) to be described hereinafter.

Resistive shunt 78 which generates a signal proportional to the current drain on the battery is also shown on FIG. 8. This voltage representative of the current drain on the battery is applied to operational amplifier 114 in FIG. 10.

Figure 9:
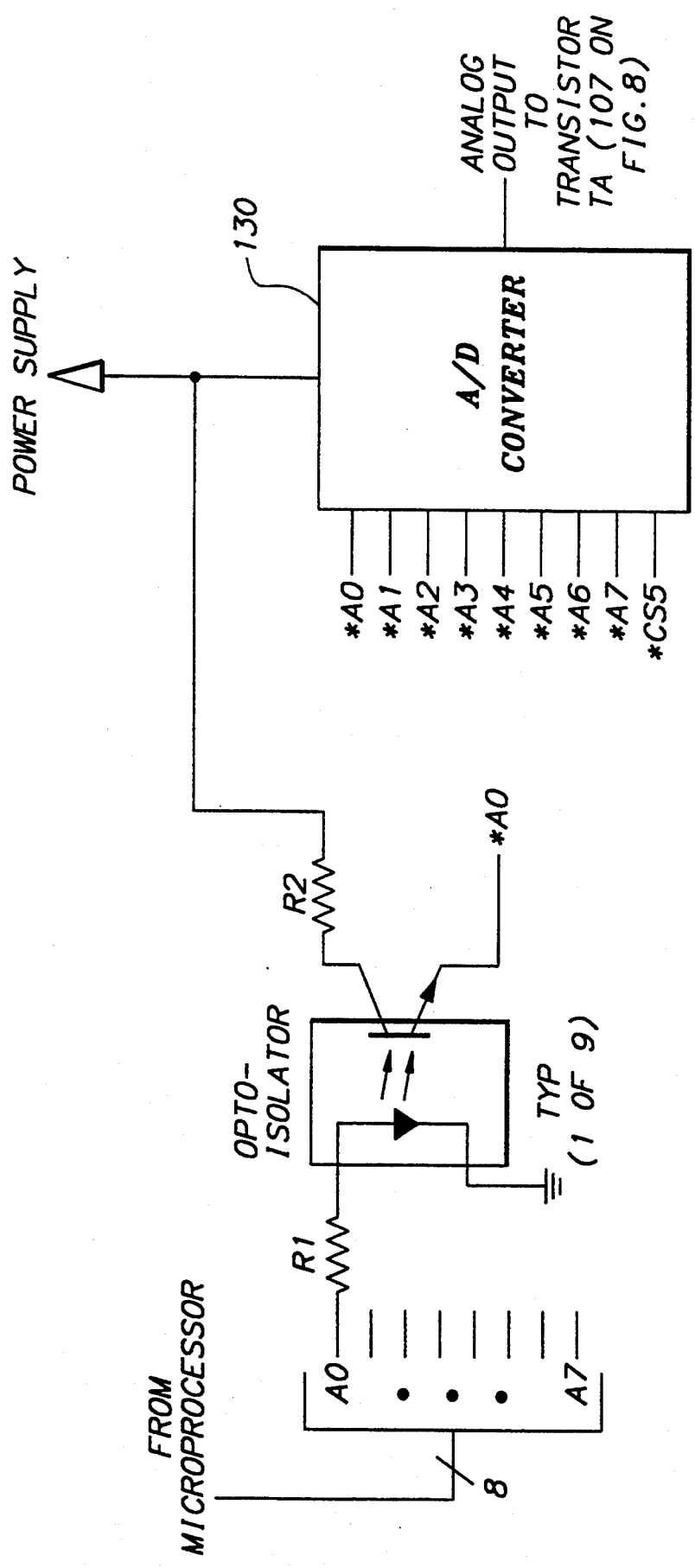
FIG. 9 is a block diagram of the digital to analog interface circuitry utilized to provide fine adjustment to the resistive load in accordance with the present invention.
Figure 10:
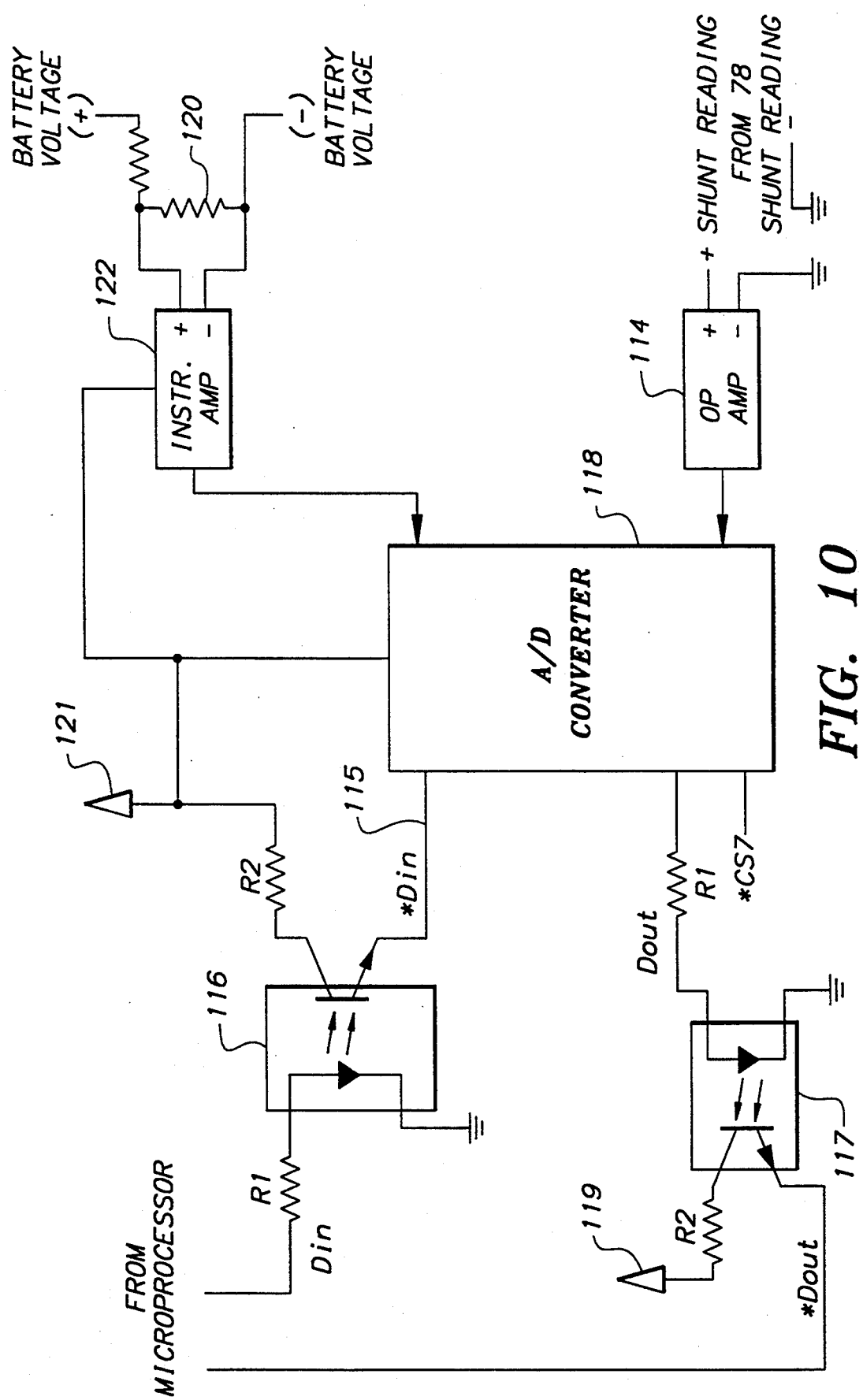
FIG. 10 is a block diagram of the battery voltage and current interface portion of the electrical circuit of the present invention.

Referring to FIG. 9, the circuitry for generating the analog signal to control the current flow through transistor TA (transistor 107) of FIG. 8 is shown. Analog to digital converter 130 receives from the data bus optically isolated signals A0 through A7, A0 being shown in FIG. 9. This signal is generated upon the occurrence of control signal CS5 from decoder 94. The analog output, generated from the digital input, controls the conductivity of transistor TA to precisely control the current flow through resistor 106 of FIG. 8, thereby precisely maintaining a constant load current on the battery throughout the test.

Referring to FIG. 10, there is shown the input in the lower right of the shunt reading from 78 being fed to a precision operational amplifier with a large gain ratio in order to boost the low level signal to a reasonable voltage, typically a 5 volt scale reading. The analog current data from shunt 78 is a very important signal since this is the only feedback to determine the actions required by the microcontroller 86 for controlling the switching of the resistances and hence the maintenance of a constant current flow. This signal is also difficult to measure since current shunts normally provide current status in terms of millivolts. Noise may easily affect a low level signal such as this and most analog to digital converters are not as accurate in measuring voltages in the millivolt range.

The battery voltage and current interface circuit of FIG. 10 is optically isolated from the microcontroller circuitry by means of optical isolators, such as optical isolators 116 and 117 as shown. Other signals to the analog digital converter, including a control signal CS7 shown thereon and the system clock signal (not shown) which is supplied throughout, are electrically isolated by optical isolators. Isolation is important to prevent the high levels of noise produced by the digital switching from affecting the highly sensitive analog to digital converter circuitry 118. Additional accuracy is obtained by maintaining a common ground between this circuitry and the negative connection to the shunt. The circuitry on each side of the optical isolators is connected to different power supplies, for example power supply 119 is the microprocessor power supply and power supply 121 is the battery voltage and current interface circuit power supply.

If additional load banks are used in tandom for the test, this circuitry would accommodate additional current inputs. The microcontroller would then add all currents together to obtain the total current flowing from the battery under test.

The total battery voltage is also collected here. A voltage divider network 120 is utilized to reduce the battery voltage to a value consistent with the ratings of the analog to digital converter. Since the voltage divider resistors can be set extremely accurately, little error is accumulated. Since the negative battery terminal is not at the same voltage as the negative lead of the shunt, the total battery voltage must be normalized to a common ground in order for the analog to digital converter to determine the actual voltage. This is accomplished via an instrumentation amplifier 122. Instrumentation operational amplifier 122 converts a differential voltage into a single ended voltage referenced to a common ground. A presently preferred instrumentation amplifier is commercially available under the designation 1NA120AP from Burr Brown, P.O. Box 11400, Tucson, Ariz. 85734. However, it is understood that other suitable instrumentation amplifiers may be utilized.

The analog to digital converter circuit 118 converts the analog inputs into a digital word "D out". This information is sent to the microcontroller via optical isolator 117 and bus 96. The microcontroller 86 receives data from analog to digital converter 118 upon the occurrence of control signal CS7 and in response to address information on line 115 received from the microprocessor via data bus 96 and optical isolator 116.

Figure 11:
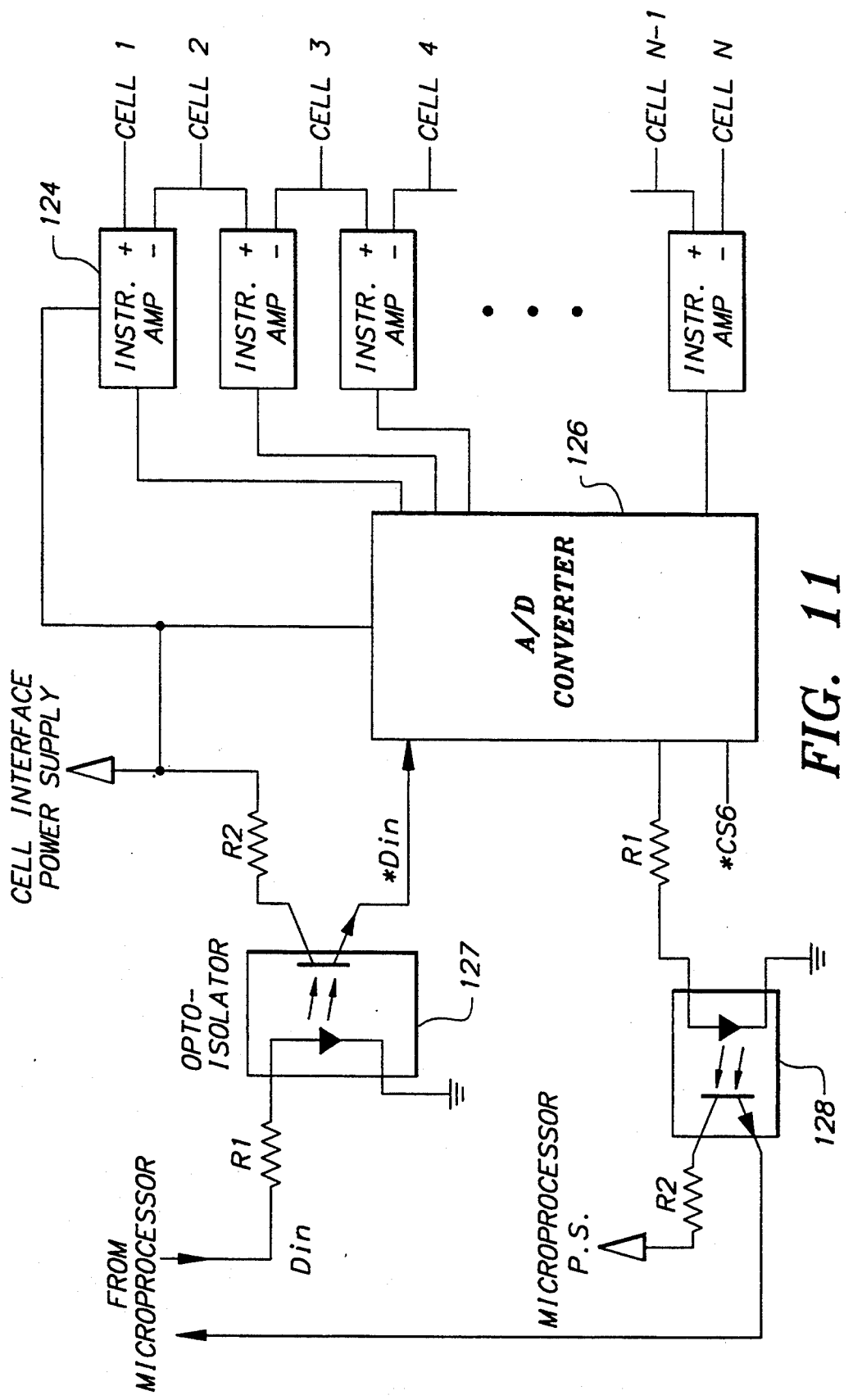
FIG. 11 is a block diagram of the cell voltage interface of the electrical circuit in accordance with the present invention.

Referring to FIG. 11, circuitry for the cell voltage interface is illustrated. The junction between each of the cells is connected to the inputs as shown in FIG. 11 wherein they are fed through instrumentation amplifiers 124 to analog to digital converter 126. This applies the voltage of each cell to its corresponding instrumentation amplifier 124. These instrumentation amplifiers may preferably be of the same type as those described with respect to instrumentation amplifiers 122. This circuitry is also optically isolated from the microcontroller 86 by optical isolators, such as optical isolators 127 and 128 as shown in FIG. 11. As described previously, all of the circuitry of the microprocesor is electrically isolated by optical isolators from the DC source voltages being tested, the resistors and the switching circuitry, and accordingly a clock signal and control signal CS6 would also be transmitted through an optical isolator (not shown). As shown in FIG. 11, optical isolator 127 is connected to the cell interface power supply and optical isolator 128 is connected to the microprocessor power supply. In a preferred embodiment, the optical isolators 128 may be those available from Hewlett Packard Corporation under the designation HCPL-2200. It is understood that other optical isolators may be utilized in practicing the invention.

The analog voltage data from the battery is a wide range of potentials. For a 24 cell battery, the potentials may vary up to 50 volts from cell 1 to cell 24. Since it is most desirable to utilize the full range of the analog to digital converter, it is important that a multiple input analog to digital converter (which is most cost effective) have inputs all referenced to the same potential. This can be accomplished by utilizing instrumentation amplifiers. The instrumentation amplifiers take the differential cell voltages and accurately convert them to a single ended output referenced to a common ground. Since the input common mode voltage on operational amplifiers cannot exceed the power supply voltage, and the maximum power supply voltage differential is approximately 30 volts, one converter can serve about 12 cells. Accordingly, two analog digital converters serially linked are utilized to service 24 cells.

As may be seen from FIG. 11, the output of the analog to digital converter is a digital word representative of the cell voltage which is supplied via optical isolator 128 and data bus 96 to microprocessor 86 upon receipt of an appropriate address signal from the microprocessor through optical isolator 127, as well as a suitable control signal CS6 and the system clock signal.

Figure 12:
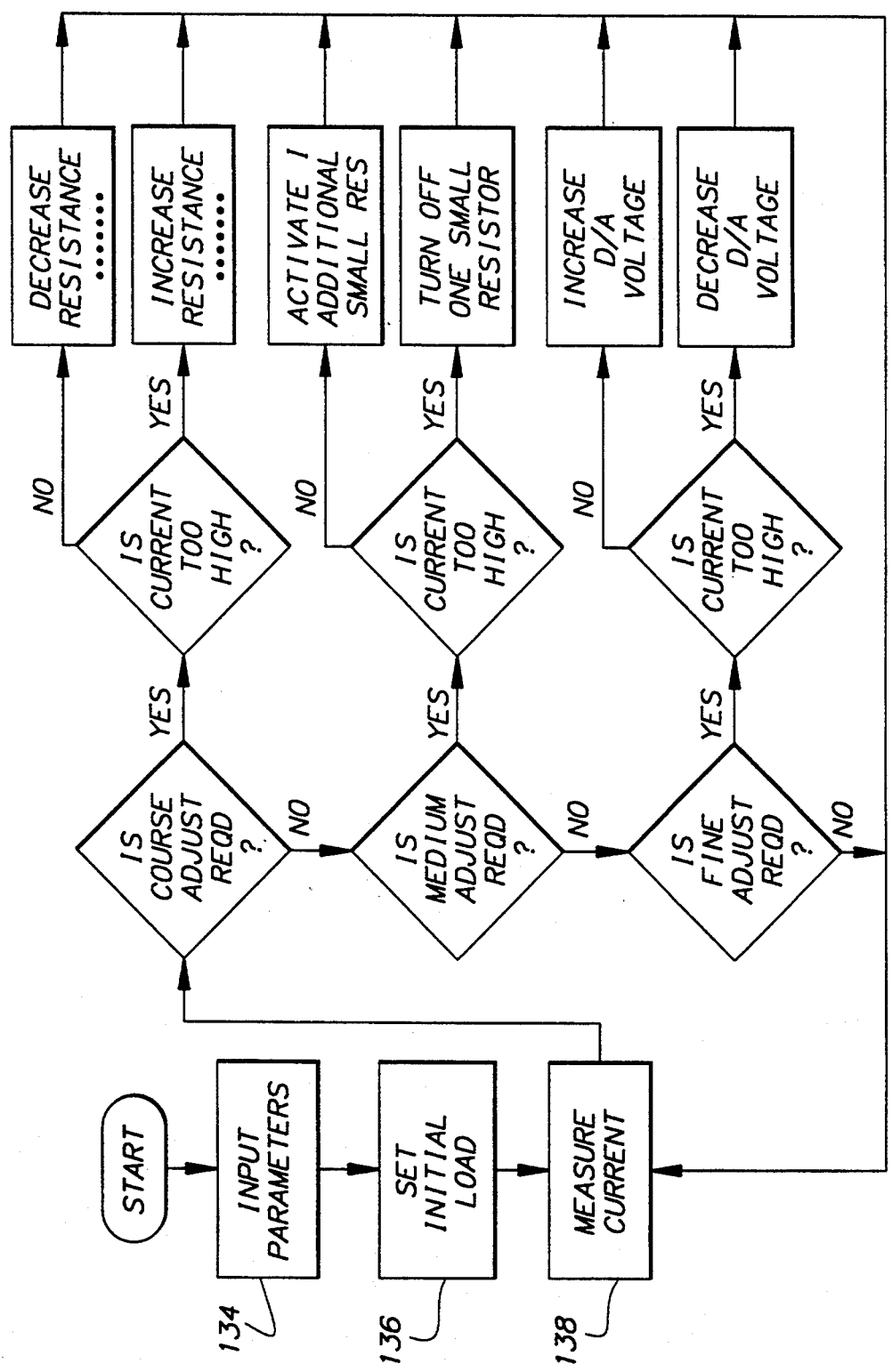
FIG. 12 is a flow chart of the operation of the circuitry of the present invention.

Referring now to FIG. 12, there is shown a flow chart of the operation of the automatic load bank of the present invention. The desired current is put in by input buttons 88 (shown in FIG. 6) and illustrated by block 134. Microprocessor 86 then sets the load bank up for initial load conditions as illustrated by block 136. With the initiation of the test, actual current is then measured and compared to the set parameters as illustrated by block 138. As illustrated in FIG. 12, the microprocessor 86 then determines if course, medium or fine adjustment is required. Course adjustment is required when the actual current is significantly different from the desired current. Medium adjustment is required if the course adjustment will cause the actual current to overshoot or undershoot the desired current. Fine adjustment is required if the medium adjustment will cause the actual current to overshoot or undershoot the desired current. Fine adjustment is also utilized to maintain precise load bank current through adjustment of current flow through transistor 107 and resistor 106 as previously described (in response to the output of digital to analog converter 130).

When actual current is equal to the desired current, no adjustment is required and the cycle continues, constantly monitoring current and comparing it to the preset values. Course adjustment is comprised of adding or subtracting large edge wound power resistors by switching power transistors 24 or by shorting out portions of the wire wound resistors via taps 17 and SCR's 26. Medium current adjustment is made by adding or removing smaller power resistors as shown in FIG. 8. Fine adjustment and precise control of the current is accomplished by increasing or decreasing the voltage output of the digital to analog converter 130 shown in FIG. 9. The output voltage of digital to analog converter 130 controls the base of power transistor 107, which thereby precisely controls the collector/emitter junction current through resistor 106. Small voltage changes in the output voltage of digital to analog converter 130 result in small current changes through the collector/emitter junction of power transistor 106, thereby providing fine control of current through the load bank.

In view of the above, the present invention may be embodied in other specific forms comprising various equivalents of the invention without departing from the spirit or essential attributes thereof and, accordingly, reference should be made to the appended claims, rather than to the foregoing specification as indicating the scope of the invention.

I claim:

1. A compact high-power resistor load bank apparatus for controlled loading of a DC electrical source, comprising:
   means for housing said resistor load bank;
   one or more edge-wound high-power resistor means comprising solid helical resistive coils of flat-sided substantially rectangular oblong cross section mechanically from a first side to a second opposite side of said means for housing mounted across and within said means for housing but electrically insulated therefrom by insulting means, said resistive coils extending outwardly from said insulating means so as to form cooling fins;

fan means including a venturi panel which spans across and is disposed within said means for housing, for directing a flow of air through said venturi panel and directly past said high-power resistor means so that the flow of air travels in a direction substantially parallel to the flattened sides comprising said cooling fins of said high-power resistor means; and, means for electrically connecting said resistor load bank to said DC electrical source;

whereby all of said means are disposed to minimize the obstruction of airflow and maximize the power handling ability of said load bank, and said high-power resistor means are rendered capable of continuously dissipating power at a rate in excess of twice their unfanned power ratings.

2. A load bank in accordance with claim 1 wherein said housing is provided with a lower and an upper expanded metal protective screen, and special cable of high current capacity and of small diameter is utilized for connections to said edge wound wire resistors and other components such that air flow resistance therefrom is minimized.

3. A load bank in accordance with claim 1 wherein said edge wound high-power resistor means are provided with taps which are connected to silicon controlled rectifiers which may be energized to short out a portion of said high-power resistor means.

4. A load bank in accordance with claim 1 capable of continuously dissipating in excess of 40,000 watts and weighing less than 200 pounds.

5. A load bank in accordance with claim 1 capable of continuously dissipating in excess of 40,000 watts and having dimensions of approximately 20 inches wide, 26.5 inches deep and 34 inches high, including wheels having a diameter of approximately six inches.

6. A load bank in accordance with claim 1 wherein said DC electrical source comprises one or more batteries.

7. A load bank in accordance with claim 1 wherein said DC electrical source is a DC power supply.

8. A load bank in accordance with claim 7, wherein said DC power supply includes rectifiers.

9. A load bank in accordance with claim 1 wherein said fan means enables said high-power resistor means to dissipate power at a rate of approximately six times their unfanned power rating.

10. A load bank in accordance with claim 1 wherein said edge-wound high-power resistor means are removably mounted on racks within said means for housing.

11. A load bank in accordance with claim 10 wherein said racks are comprised of threaded bars mounted at a predetermined spacing.

12. A load bank in accordance with claim 10 wherein said high-power resistor means are staggered on said racks whereby said flow of air is enhanced for improved cooling of said high-power resistor means.

13. A load bank in accordance with claim 1 wherein said fan means is mounted within said housing means below said high-power resistor means, and wherein said fan directs said flow of air upwardly through said housing means whereby natural convection cooling of said high-power resistor means is enhanced by said fan means.

14. A load bank in accordance with claim 1 wherein said DC electrical source comprises one or more batteries connected with a DC power supply.

* * * * *